United States Patent [19]
Young

[11] Patent Number: 5,801,568
[45] Date of Patent: *Sep. 1, 1998

[54] PRECISE DELAY LINE CIRCUIT WITH PREDETERMINED RESET TIME LIMIT

[75] Inventor: David Young, San Jose, Calif.

[73] Assignee: Advanced Micro Devices, Inc., Sunnyvale, Calif.

[*] Notice: The term of this patent shall not extend beyond the expiration date of Pat. No. 5,539,348.

[21] Appl. No.: 567,979

[22] Filed: Dec. 6, 1995

Related U.S. Application Data

[63] Continuation of Ser. No. 214,897, Mar. 17, 1994, Pat. No. 5,539,348.
[51] Int. Cl.$^6$ .................................................. H03H 11/26
[52] U.S. Cl. ........................... 327/284; 327/143; 327/198; 327/271
[58] Field of Search ................................. 327/142, 143, 327/172, 175, 198, 262, 263, 264, 269, 270, 271, 272, 284, 285

[56] References Cited

U.S. PATENT DOCUMENTS

| | | | |
|---|---|---|---|
| 3,599,016 | 8/1971 | Leightner | 327/198 |
| 4,266,145 | 5/1981 | Amacher et al. | 327/198 |
| 4,494,021 | 1/1985 | Bell et al. | 327/262 |
| 4,496,861 | 1/1985 | Bazes | 327/284 |
| 4,716,322 | 12/1987 | D'Arrigo et al. | 327/143 |
| 4,975,605 | 12/1990 | Bazes | 327/258 |
| 5,101,419 | 3/1992 | Lowe et al. | 327/175 |
| 5,146,121 | 9/1992 | Searles et al. | 327/281 |
| 5,192,886 | 3/1993 | Wetlaufer | 327/284 |
| 5,309,037 | 5/1994 | Curley et al. | 327/142 |
| 5,367,490 | 11/1994 | Akimoto et al. | 327/172 |

*Primary Examiner*—Terry Cunnigham
*Attorney, Agent, or Firm*—Sawyer & Associates

[57] ABSTRACT

A delay line circuit is provided that precisely delays the incoming referenced clock signal by utilizing two delay cells and a sample-and-hold circuit. The circuit eliminates the need for sensing circuitry at the output to determine if the need to monitor the delay line circuit is operating in an undesirable operation. By eliminating the sensing circuitry the reliability of delay line circuit is significantly increased.

14 Claims, 10 Drawing Sheets

PRECISE DELAY LINE CIRCUIT WITH PREDETERMINED RESET TIME LIMIT

This is a Continuation of application Ser. No. 0/214,897, filed Mar. 17, 1994, not U.S. Pat. No. 5,539,348.

FIELD OF THE INVENTION

The present invention relates generally to integrated circuits and more particularly to integrated circuits utilized for data sampling.

BACKGROUND OF THE INVENTION

In mix mode CMOS VLSI integrated circuit design, data sampling has been used in many applications, for example, for waveform synthesis, data acquisition, and high speed digital/analog conversion. In applications that deliver a high frequency output signal, a high frequency sampling clock is required and a delay line circuit is often used to provide the high frequency sampling clock. An ordinary integrated delay line circuit is sensitive to variations in power supply changes, temperature changes and process variation, therefore, a more precise delay line technology is needed to compensate for those effects.

Prior art methods of delivering timing pulses with delay are described in U.S. Pat. No. 4,496,861 entitled "Integrated Circuit Synchronous Delay Line", U.S. Pat. No. 4,975,605 entitled "Synchronous Delay Line With Automatic Reset", and in an article entitled "A Novel Precision MOS Synchronous Delay Line", IEEE Journal of Solid State Circuits, Volume SC-20, pp. 1265–1271, December 1985.

Though the above prior art provides timing pulse delay with negative feedback to reduce sensitivity to variations, the output from each delay tap is not a true synchronous delay of the incoming clock signal. In many applications, a more precise timing delay of the incoming reference clock signal is required to provide an accurate data. Although an automatic reset circuit utilized with a delay line circuit has been disclosed in the prior art, the delay line circuit requires sensing circuitry to determine whether or not the delay line circuit is operating in a fundamental mode.

What is needed is an improved precise synchronous delay line circuit is needed to resolve this and other problems associated with conventional delay line circuits. The precise delay line circuit should be easily implemented in existing technologies. It should be cost effective and easily adapted to existing product. Finally, the delay line circuit should eliminate the need for the sense circuitry required in conventional delay line circuits.

SUMMARY OF THE INVENTION

The present invention is a delay line circuit comprising a delay stage for receiving a clock signal, the delay stage including a plurality of delay cells, the delay cells being coupled together to provide a delayed clock signal; a sample and hold circuit coupled to the delay stage for sampling the delayed clock signal and the clock signal to determine a phase difference therebetween, and a reset limiting circuit coupled to the delay stage and the sample and hold circuit for receiving a system reset signal and the clock signal and for resetting at a transition edge of the system reset signal for a predetermined period of time. The delay line circuit provides a true representation of the delay of the clock signal to ensure accuracy in many integrated circuit applications.

DETAILED DESCRIPTION OF THE DRAWINGS

The present invention relates to an improvement in a delay line circuit utilized in data sampling applications. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
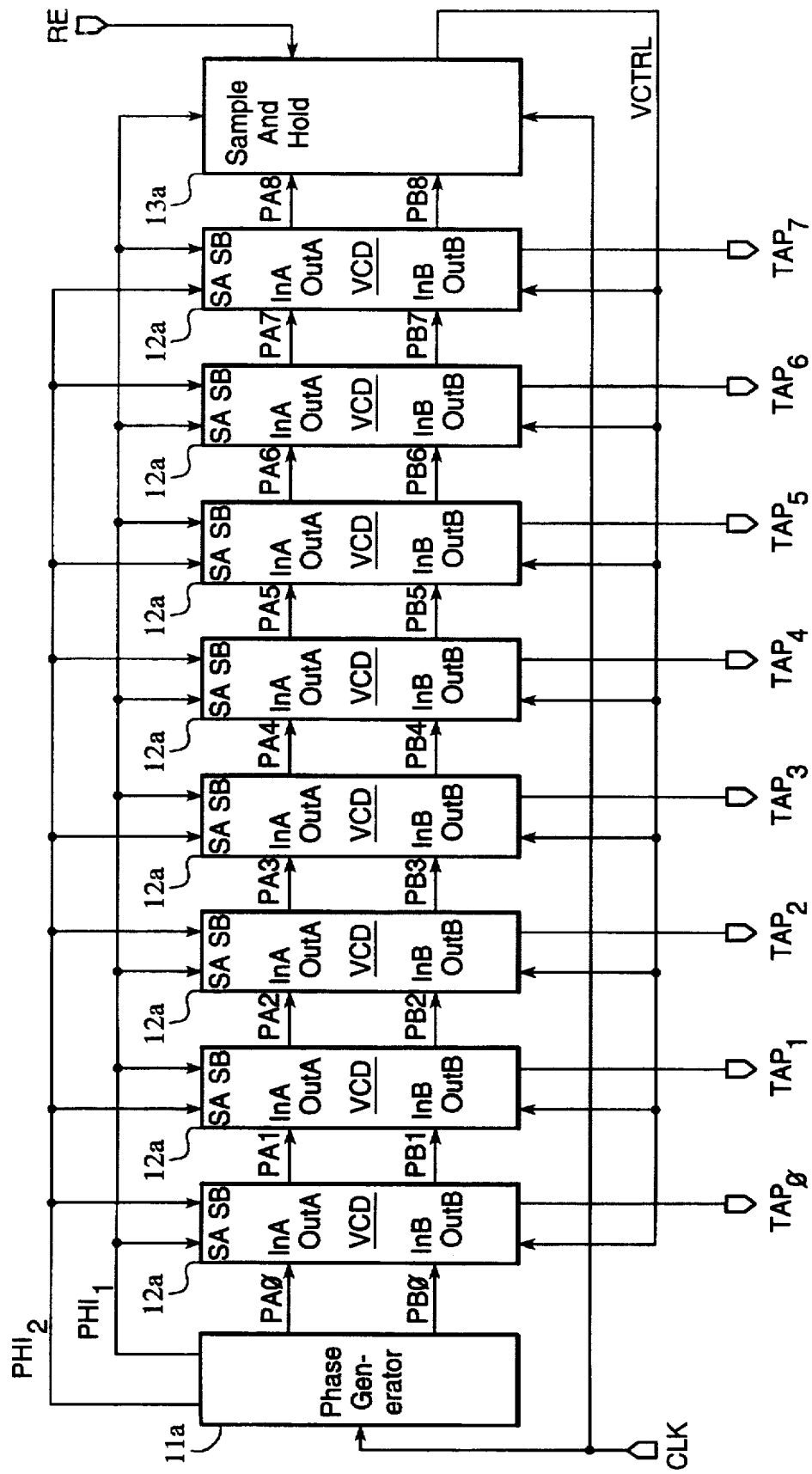
FIG. 1 is a block diagram of a prior art synchronous delay line circuit.

Referring now to FIG. 1, a conventional synchronous delay line (SDL) 10a is shown. SDL 10a includes a phase generator 11a that is used to provide two clocking phases $PHI_1$ and $PHI_2$ and separate delayed clock phases $PA_n$ and $PB_n$. Eight VCD stages 12a are shown, but the actual number is a design choice. VCD stages 12a are implemented to operate with the new clock phasing signals.

The phase generator 11a receives as its input a reference clock signal CLK and divides the frequency of the clock signal CLK by 2 to generate two 50% duty cycle complementary clock phases $PHI_1$ and $PHI_2$. $PHI_1$ and $PHI_2$ are used to control the outputs of the individual VCD stages 12a. The clocking signal CLK is also coupled as an input to the sample-and-hold circuit 13a.

Two additional complementary clock phases $PA_0$ and $PB_0$ are provided as outputs from phase generator 11a. Signals $PA_0$ and $PB_0$ are also derived from the reference clock signal CLK and have a 50% duty cycle and are complementary to each other. $PA_0$ and $PB_0$ serve as the trigger inputs to the first VCD stage 12a. Although clock phases $PHI_1$ and $PHI_2$ can be bemused to serve as the trigger inputs to the first VCD stage 12a, separate phase signals $PA_0$ and $PB_0$ are utilized since $PHI_1$ and $PHI_2$ are typically slowed by the heavy capacitive loads that they typically must drive.

The various delays of SDL 10a are provided by each of the VCD stages 12a. Although a variety of circuits can be implemented for each of the stages 12a, one example is described in the aforementioned U.S. Pat. No. 4,496,861. Delay of the timing pulse output from each stage 12a, $TAP_n$, is determined by using the following equation:

$$TDEL_n = (n+1)TP/N + t_{ERR} \qquad \text{(Equation 1)},$$

wherein $TDEL_n$ is the delay of the timing pulse output by a given n stage; N is the total number of stages; TP is the period of the clock signal CLK; and TERR is a small timing error. The tap outputs from each of the VCD stages 12a are provided by exclusively ORing (XORing) the $PA_n$ and $PB_n$ outputs from each VCD stage with the pair of complementary clock phases $PHI_1$ and $PHI_2$. These clock phases are triggered by the reference clock CLK to switch at the start of a new clock cycle when $PHI_1$ and $PHI_2$ are coupled to each of the VCD stages 12a.

When $PHI_1$ and $PHI_2$ switch, all of the SDL 10c taps go inactive. Subsequently, each tap becomes active after a precise delay time determined by Equation 1. The $PA_n$ and $PB_n$ outputs from each stage 12a are coupled as the clocking inputs to its subsequent VCD stage 12a. The outputs of the final VCD stage 12a are coupled as inputs to the sample-and-hold circuit 13a, as are the clocking signals CLK and $PHI_1$.

The delay of each VCD stage 12a is controlled by an analog control voltage VCTRL, which is generated as an output from the sample-and-hold circuit 13a and coupled back to each VCD stage 12a. If VCTRL is high, the delay of the stages 12a is long, while if VCTRL is low, the delay is short. Because SDL 10a is comprised of N identical delay stages, each stage provides a delay equal to 1/N of the overall delay.

The sample-and-hold circuit 13a samples the value of the output voltage of the last VCD stage 12a at the instant that the clock phases $PHI_1$ and $PHI_2$ transition. The delay control voltage VCTRL is provided as a feedback voltage to each of the stages 12a for the purpose of providing the delay control. If the overall delay through SDL 10a is shorter than the clock period (referred to as TP), a high voltage is sampled at the last VCD stage 12a, and, as a consequence, VCTRL increases in its voltage value. Alternatively, if the overall delay through the VCD stages 12a are longer than the clock period TP, a low voltage is sampled at the last VCD stage 12a, and, as a consequence, VCTRL decreases in value. When VCTRL decreases in value, the overall delay of the SDL decreases also. A pair of sampling capacitors are typically used to retain the sampled voltage.

Further, as shown in FIG. 1, a reset signal is coupled as an input to the sample-and-hold circuit 13a for resetting the SDL 10a. The operation and implementation of SDL 10a is based on the aforementioned U.S. Pat. No. 4,496,861.

A reset input to sample-and-hold circuit 13a is used to reset SDL 10a, and such resetting is needed before proper SDL operation is guaranteed. Such resetting of the SDL 10a is necessary so that SDL 10a enters its fundamental mode of operation. Typically an external reset signal is provided, which requires the presence of a dedicated reset pin on the device. An externally-provided reset also necessitates waiting a period of time, typically hundreds of clocks in length, during which the SDL stabilizes in its fundamental mode of operation. During this stabilization period, the operation of the integrated circuit in which the SDL is used must be inhibited.

Figure 2:
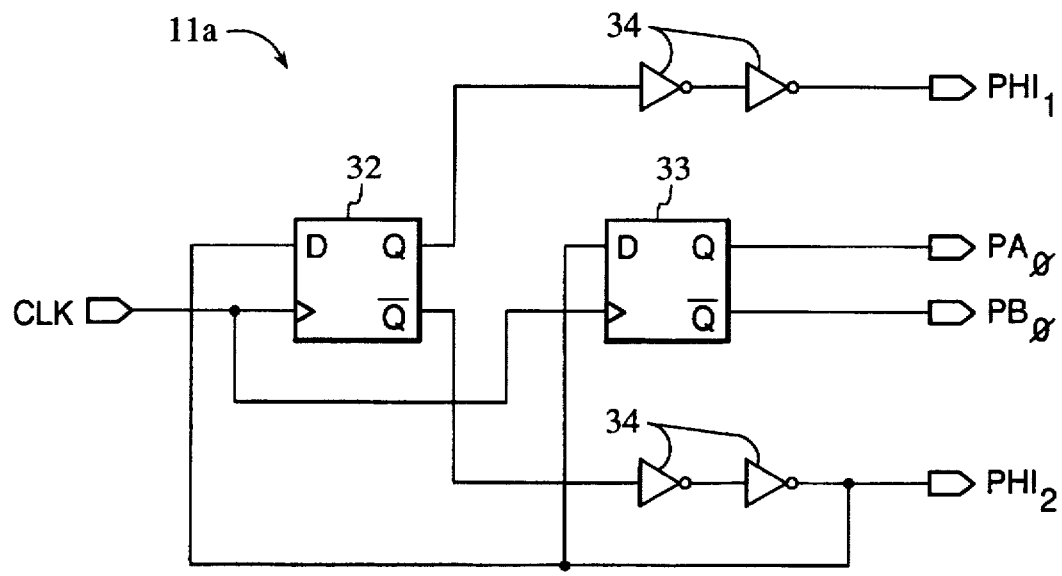
FIG. 2 is a schematic diagram of a phase generator of the synchronous delay line of FIG. 1.

Referring to FIG. 2, the phase generator 11a receives a reference clock signal CLK as its input and divides the frequency of the CLK signal by two to generate two 50% duty cycle complementary clock phases $PHI_1$ and $PHI_2$. The CLK signal is coupled to the clock input of a D-type flip-flop 32 in which $PHI_1$ is obtained from the output Q while $PHI_2$ is obtained from the output Q/ (/ is hereinafter used to indicate a complementary condition). Both $PHI_1$ and $PHI_2$ are each coupled through a dual inverter buffer stage 34. The CLK signal is also coupled to the clock input of a D-type flip-flop 33. Two additional complementary clock phases $PA_0$ and $PB_0$ are obtained from Q and Q/ outputs, respectively, of flip-flop 33. Clock phases $PA_0$ and $PB_0$ are obtained from Q and Q/ outputs, respectively, of flip-flop 33. Clock phases $PA_0$ and $PB_0$, which are logically identical to $PHI_1$ and $PHI_2$, serve as the trigger inputs to the first VCD stage 12a. Separate clock phases $PA_0$ and $PB_0$ are provided since $PHI_1$ and $PHI_2$ clock phases are typically slowed down by the heavy capacitive loading which they must drive. $PA_0$ and $PB_0$ are used since the overall precision of the SDL 10a is improved by decreasing the delay time of the trigger inputs with respect to the clock signal CLK. The D input to both flip-flops 32 and 33 are derived from the $PHI_2$ output.

Figure 3:
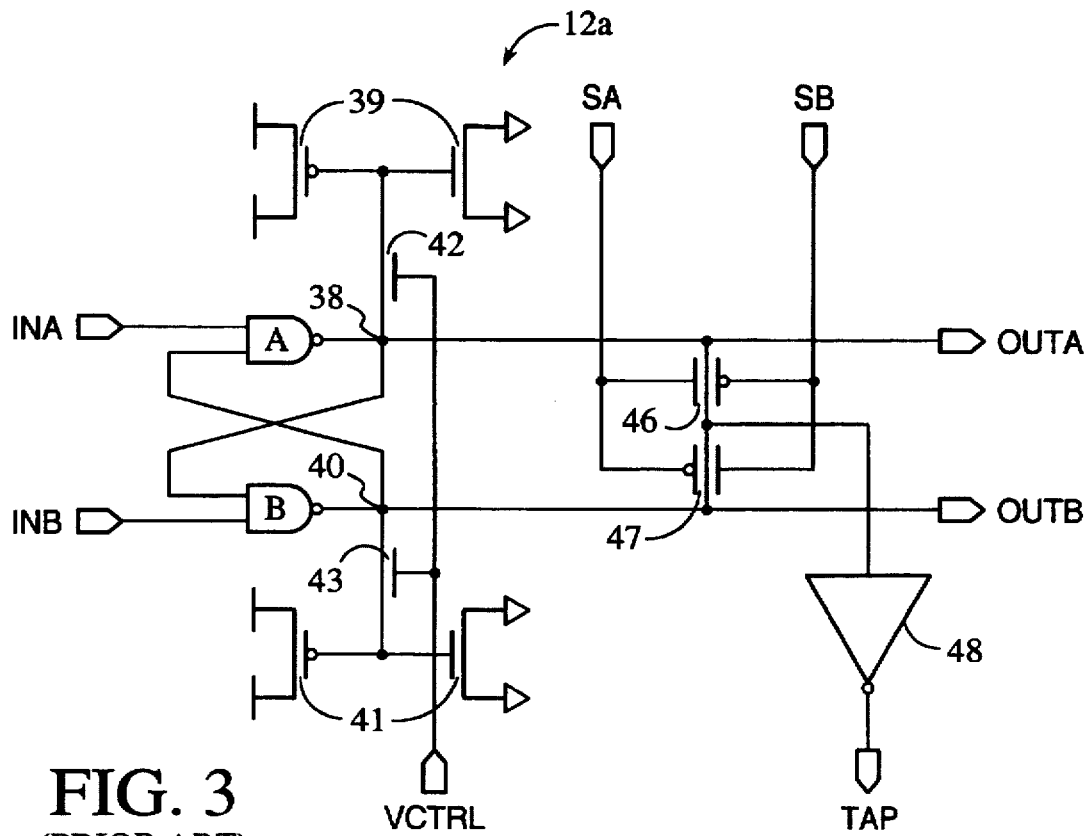
FIG. 3 is a circuit schematic diagram of a voltage controlled delay stage of the delay line circuit of FIG. 1.

Referring to FIG. 3, a diagram for one stage of the VCD stage 12a is shown in schematic form. However, it is to be appreciated that a variety of circuits can be implemented for the VCD stage 12a in the practice of the present invention without departing from the spirit and scope of the present invention. In each stage 12a, PA and PB inputs are coupled in as input A and input B, respectively, to a cross-coupled NAND gate pair, wherein the output of NAND gate A provides output A, and the output of NAND gate B provides output B. The output of NAND gate A, referenced as node 38, is coupled to a pair of CMOS capacitors 39, while the output of NAND B, referenced as node 40, is coupled to a pair of CMOS capacitors 41.

The delay of each VCD stage 12a is controlled by an analog control voltage VCTRL, which is generated by the sample-and-hold circuit 13a and which is coupled to control the coupling of node 38 to capacitors 39 and also node 40 to capacitors 41. The control voltage VCTRL controls the SDL 10a delay by causing the transition times of the cross-coupled NAND gates A and B to be long for NAND gate output voltages that are less than or equal to VCTRL minus VT, and to be short for output voltages that are greater than VCTRL minus VT. Voltage VT is the threshold voltage of each of the N-type pass devices 42 and 43 which couples the appropriate NAND gate output to its load capacitors 39 or 41, respectively. For NAND gate output voltages that are less than VCTRL minus VT, the NAND gate outputs are fully loaded down by the capacitors. Alternatively, for NAND gate output voltages that are greater than VCTRL minus VT, the capacitors are effectively disconnected from the NAND gate output nodes.

By varying VCTRL, the fraction of a NAND gate output transition during which the output is fully loaded down by the load capacitors is varied. The greater the fraction of a transition during which the output is fully loaded down, the longer the overall transition time. Either the output node 38 or 40 is coupled as the tap output, wherein the state of the clock signals coupled to SA and SB inputs determine which node is coupled as the tap output. The complementary clock phasing signals $PHI_1/PHI_2$ are provided as inputs SA and SB as shown in FIG. 1.

Each controls a pair of CMOS pass devices 46 and 47, such that when the input to SA is high and the input to SB is low, the output of NAND A is coupled as the tap output through inverter buffer 48. Alternatively, when the input to SA is low and the input to SB is high the output of NAND gate B is coupled as the tap output. The outputs A and B are coupled as PA and PB signals to the next stage.

Figure 4:
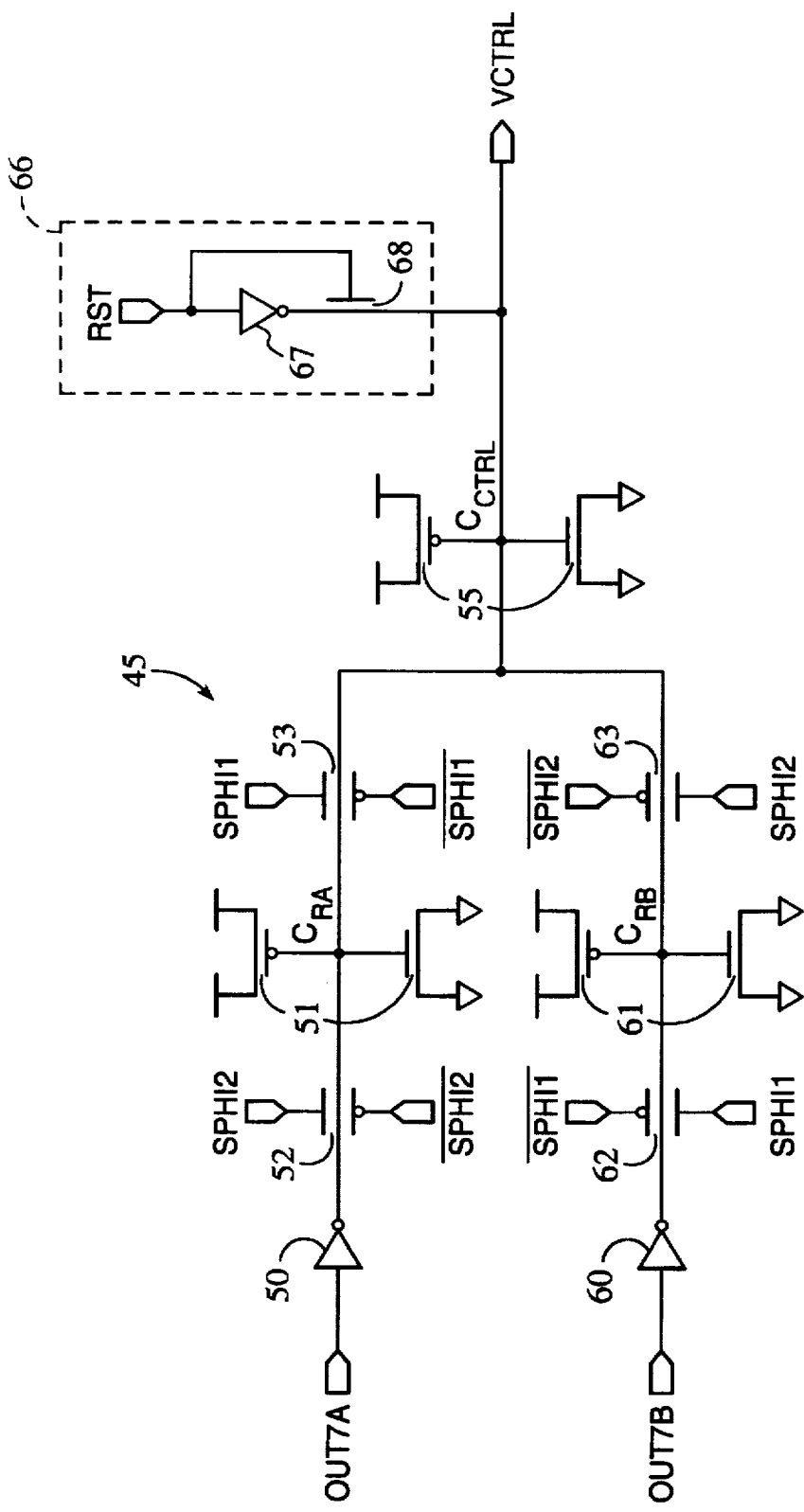
FIG. 4 is a circuit schematic diagram of a portion of a sample and hold circuit of the delay line circuit of FIG. 1.

Referring to FIG. 4, a conventional sample-and-hold circuit 13a is shown. Also coupled to the sample-and-hold circuit 13a are the clock phases $PHI_1$ and $PHI_2$, wherein clock phases $SPHI_1$ and $SPHI_2$ are generated. It is to be noted that $SPHI_1$ and $SPHI_2$ as well as their complementary outputs $SPHI_1/SPHI_2/$, are non-overlapping clock phases.

Circuit 45 samples the value of the output voltage $PA_n$ and $PB_n$ of the last VCD stage 12a at the instant that the clock phases, $SPHI_1$ and $SPHI_2$ and their complements make a transition. The sample-and-hold phasing signals $SPHI_1$ and $SPHI_2$ and their complements $SPHI_1/$ and $SPHI_2/$, are generated within the sample-and-hold circuit 13a. $SPHI_1$ is basically a replication of the clock phase signals $PHI_1$ and $SPHI_2$ which is a replication of the clock phase signal $PHI_2$.

Figure 5:
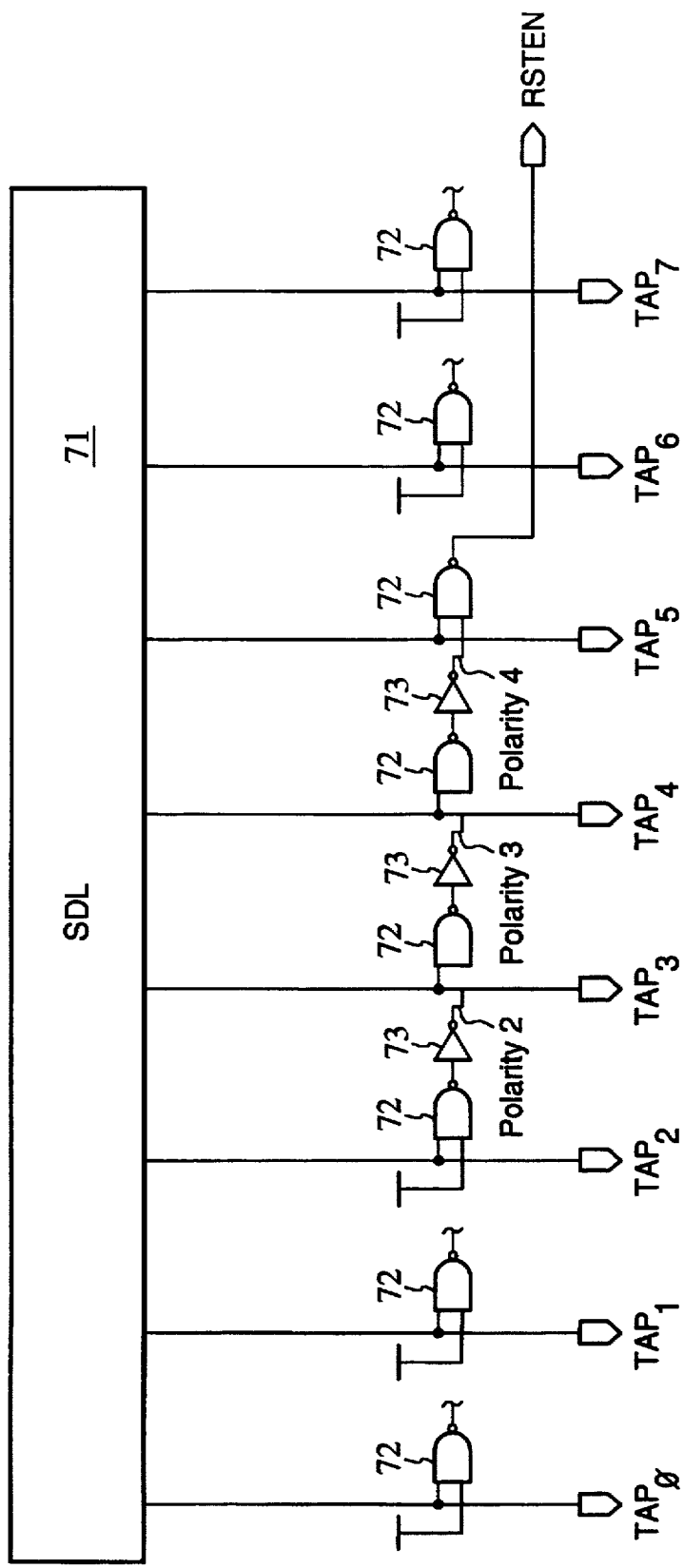
FIG. 5 is a circuit schematic diagram of a polarity checking circuit of the delay line circuit of FIG. 1.

Referring to FIG. 5, a polarity checking circuit 70 of the preferred embodiment is shown. An SDL 71 comprised of an arbitrary number of VCD stages can be used. In this particular example eight taps are used. A conventional SDL, can be used for this function. The reset scheme of the present invention as actually implemented is used with the SDL 10a of FIG. 1.

In this example, the polarities of $TAP_2$, $TAP_3$, $TAP_4$ and $TAP_5$ are checked. Nonetheless, in order to match the capacitive loads of all of the taps, so that delay skews between the taps are not unnecessarily created, $TAP_0$, $TAP_1$, $TAP_6$ and $TAP_7$ are coupled to dummy circuits which load these taps exactly as TAPs 2–5 are loaded. As shown in the example SDL 71, $TAP_0$–$TAP_7$ corresponding to the TAPn outputs of the earlier described SDL. Each TAP output is coupled as an input to a NAND gate 72. For the dummy circuitry, the corresponding NAND gates 72 have the second input of the NAND gate 72 coupled to a high voltage source and the output terminated. For those tap stages having its polarity detected, $TAP_2$–$TAP_5$, each tap stage NAND gate 72 output is coupled through an inverter to the second NAND gate 72 input of the subsequent stage. The second input to the NAND gate 72 of the first stage being detected is coupled to high, while the output of the last NAND gate of the stage being detected is coupled out to provide a reset enable signal RSTEN.

In the fundamental mode of operation, the taps of the circuit of FIG. 5 goes high successively from $TAP_0$ to $TAP_7$. For example, when $TAP_2$ goes high, signal POLARITY2 also goes high after two gate delays. Next, when $TAP_3$ goes high, POLARITY3, which is formed from the logical AND of POLARITY2 and $TAP_3$ also goes high, similarly at after two gate delays from $TAP_3$. This process is repeated sequentially down the polarity-checking circuit.

At the last stage of the detecting circuit, $TAP_5$ in the example of FIG. 5, the TAP signal causes the output of the circuit RSTEN to go low. RSTEN is then sampled by the clocking signal in the sample-and-hold circuit 13 or 13a. Because in the fundamental mode RSTEN is sampled low by the clock signal, reset is never asserted in the fundamental mode.

However, in any subharmonic mode of operation, if even a single tap has inverted polarity, RSTEN goes high. When RSTEN is then sampled active by the clock signal, reset is enabled and VCTRL is forced to zero volts. The example configuration of the polarity checking circuit 70 implements the logic equation:

$$RSTEN=[TAP/]+[TAP3/]+[TAP4/]+[TAP5/] \quad \text{(Equation 8)}.$$

Therefore, circuit 70 implements the active-low OR function which is also an active-high NAND function.

For the general case of an SDL with n taps, in which the first and last M taps are not checked for polarity, the logic equation of RSTEN is given by:

$$RSTEN=[TAP(M)/]+[TAP(M+1)/]+[TAP(N-M-1)/]. \quad \text{(Equation 9)}$$

It is to be appreciated that other circuit configurations can be readily implemented to provide the equivalent logic as described in equations 8 and 9 for use in the present invention. Further, the actual number of taps which are actually detected can also be varied without departing of this spirit and scope of the present invention.

For correct operation of the polarity-checking circuit, the propagation delay through the polarity-checking circuit must be such that in the SDL fundamental mode of operation RSTEN goes low with sufficient setup-time to the clocking signal, while in the subharmonic mode of operation, RSTEN goes high with sufficient set-up to the clocking signal.

The above-described delay line circuit although providing for a more reliable delay than prior art delay line circuits still has some disadvantages. Firstly, the system reset signal utilized to reset the delay line circuit provides for a undesirably long latency period for resetting the circuit. In addition, the polarity checking or sensing circuitry required in the prior art is relatively complex.

Figure 6:
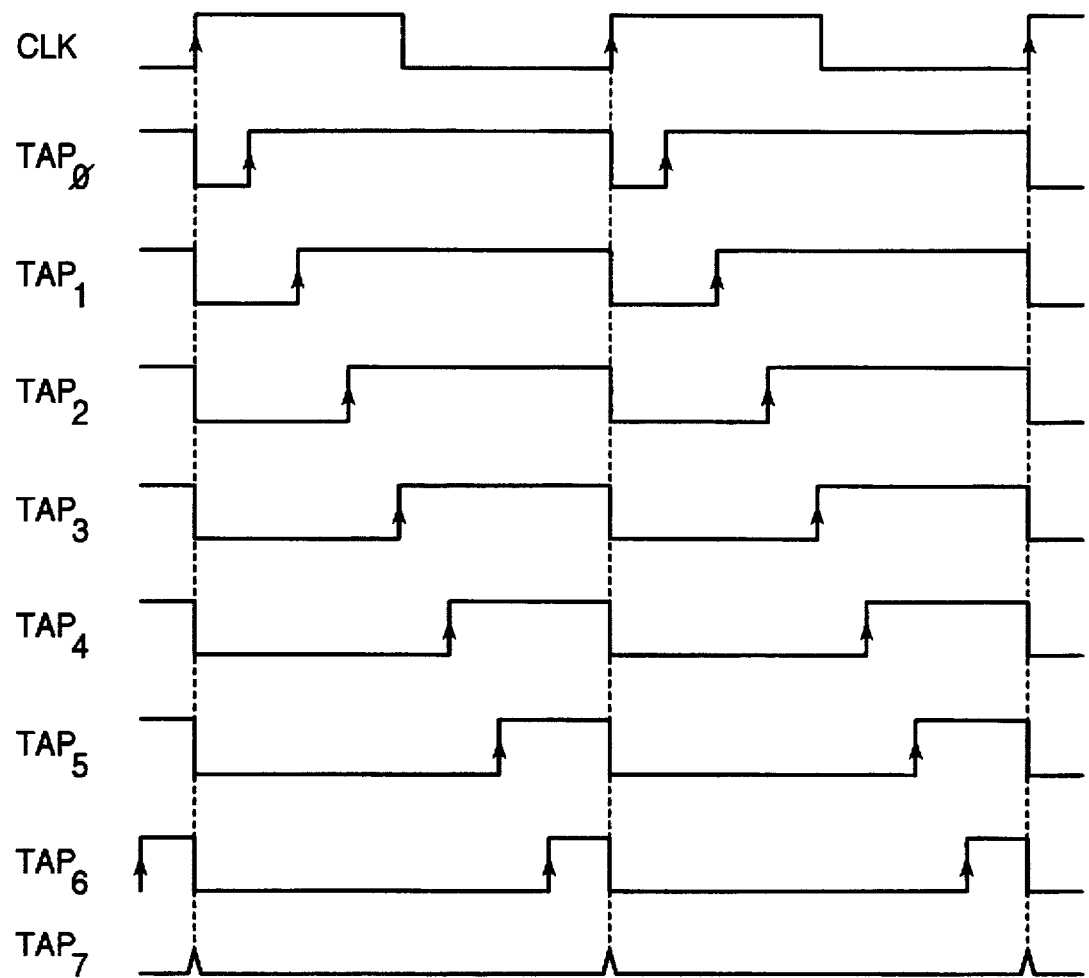
FIG. 6 shows the output waveforms for each delay line versus the input reference clock for the circuit of FIG. 1.

Referring now to FIG. 6 what is shown delay line circuits waveforms for each of the tap lines. As is seen, each of the tap lines are delayed-on one edge, in this case the rising edge, utilizing the clock signal to CMOS pass devices 46 and 47 (FIG. 3). The problem with only one edge being delayed is that this does not provide an accurate or true representation of the clock signal. In many applications this delay must be a true delay to accurately provide the data in an appropriate manner.

Figure 7A:
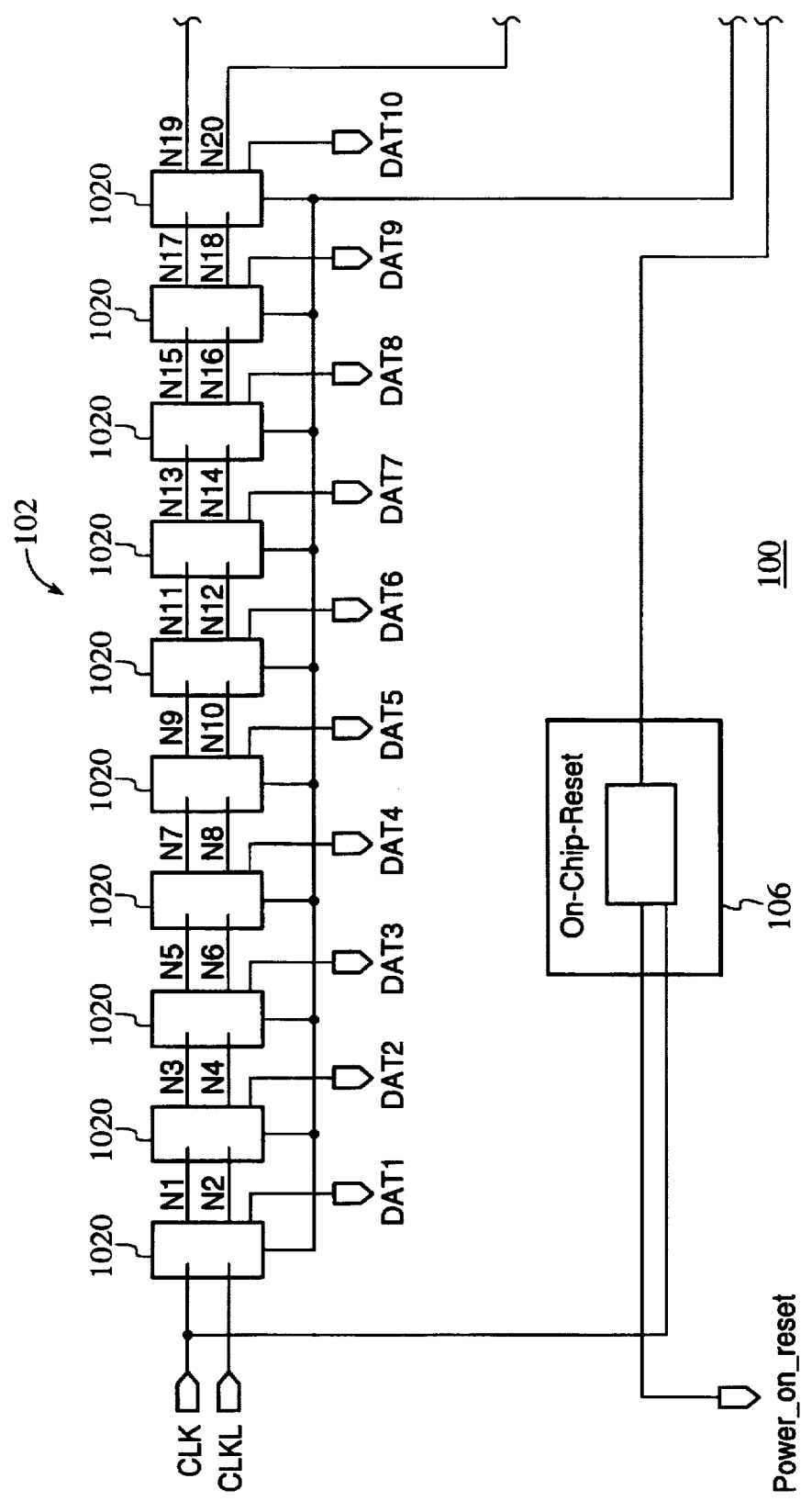
FIG. 7 is a block diagram of a delay circuit in accordance with the present invention.
Figure 7B:
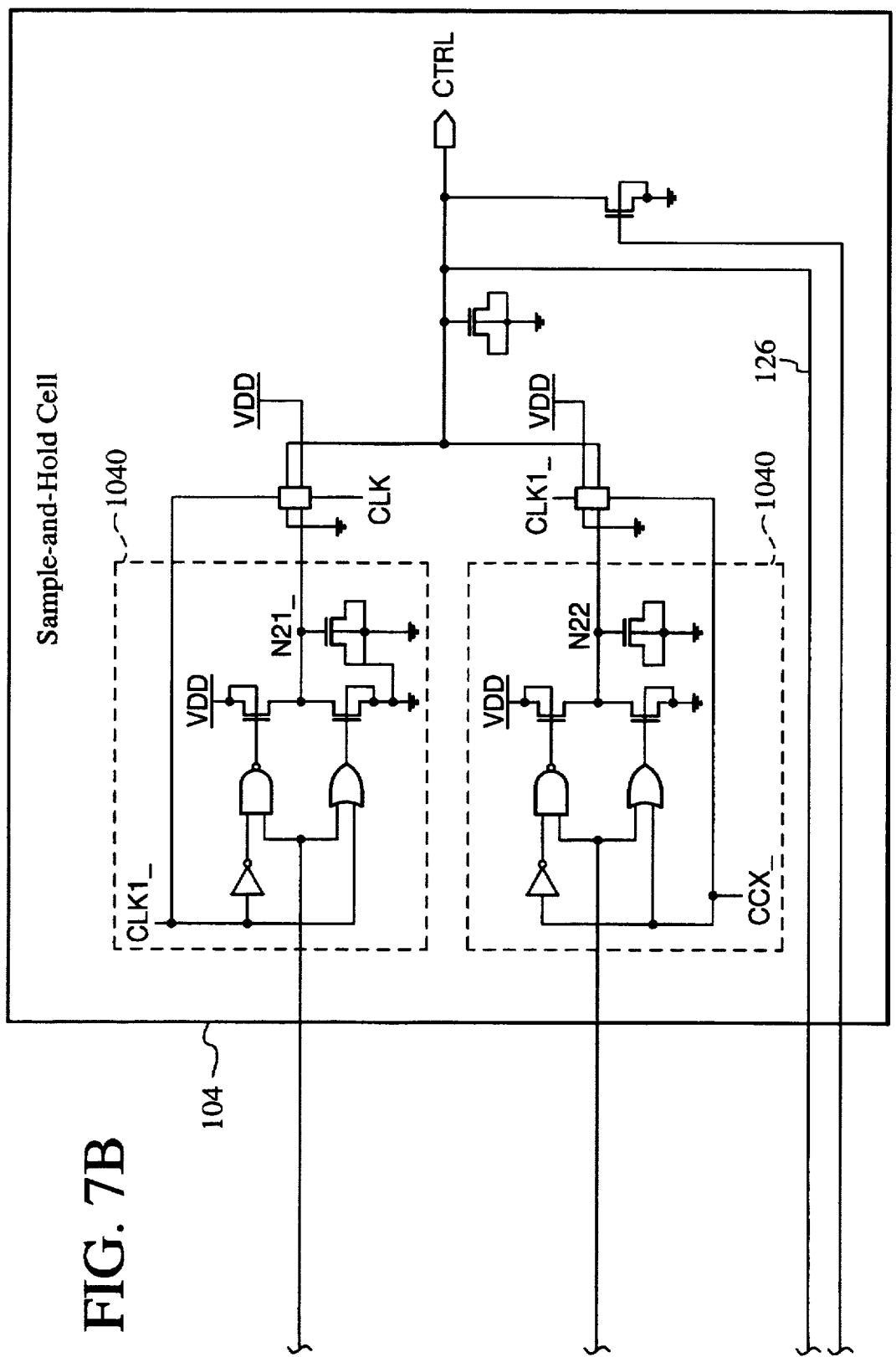

FIG. 7 shows a block diagram representation of a delay line circuit 100 in accordance with the present invention. The delay circuit comprises voltage-controlled delay circuit (VCD) 102 coupled to a sample-and-hold and low-pass filter circuit 104. An on-chip reset limit circuit 106 is coupled between the VCD 102 and sample and hold circuits.

This delay circuit 100 has significant advantages over the conventional delay line circuit 10. Through this improved delay line circuit 100 a true representation of the delay is provided, that is both edges of the clock signal are delayed in the appropriate manner. The delay line circuit 100 also through the use of the on-chip reset limiting circuit 106 provides for a predetermined time for the reset of the delay line circuit 100 which is significantly less than that of the system reset of the integrated circuit.

Figure 8:
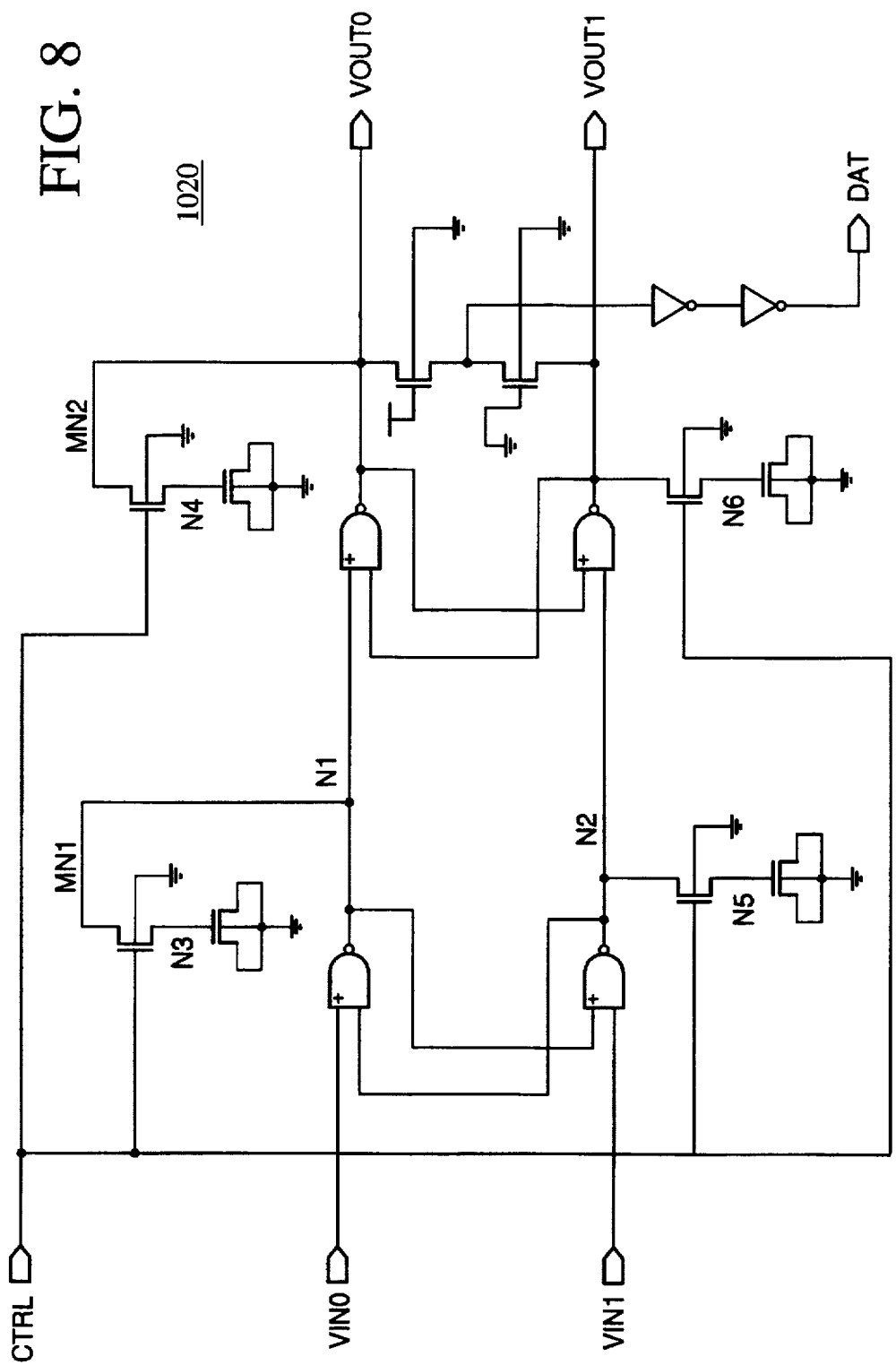
FIG. 8 is a block diagram of the voltage-controlled delay cell in accordance with the present invention.
Figure 9:
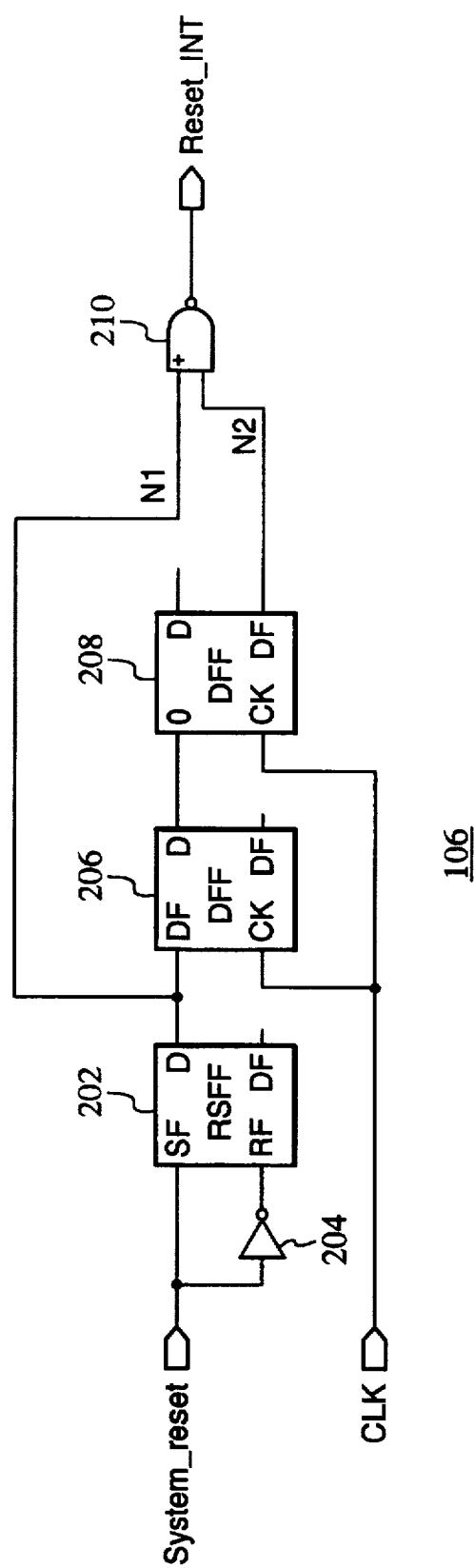
FIG. 9 is a block diagram of an on-chip reset cell in accordance with the present invention.
Figure 10:
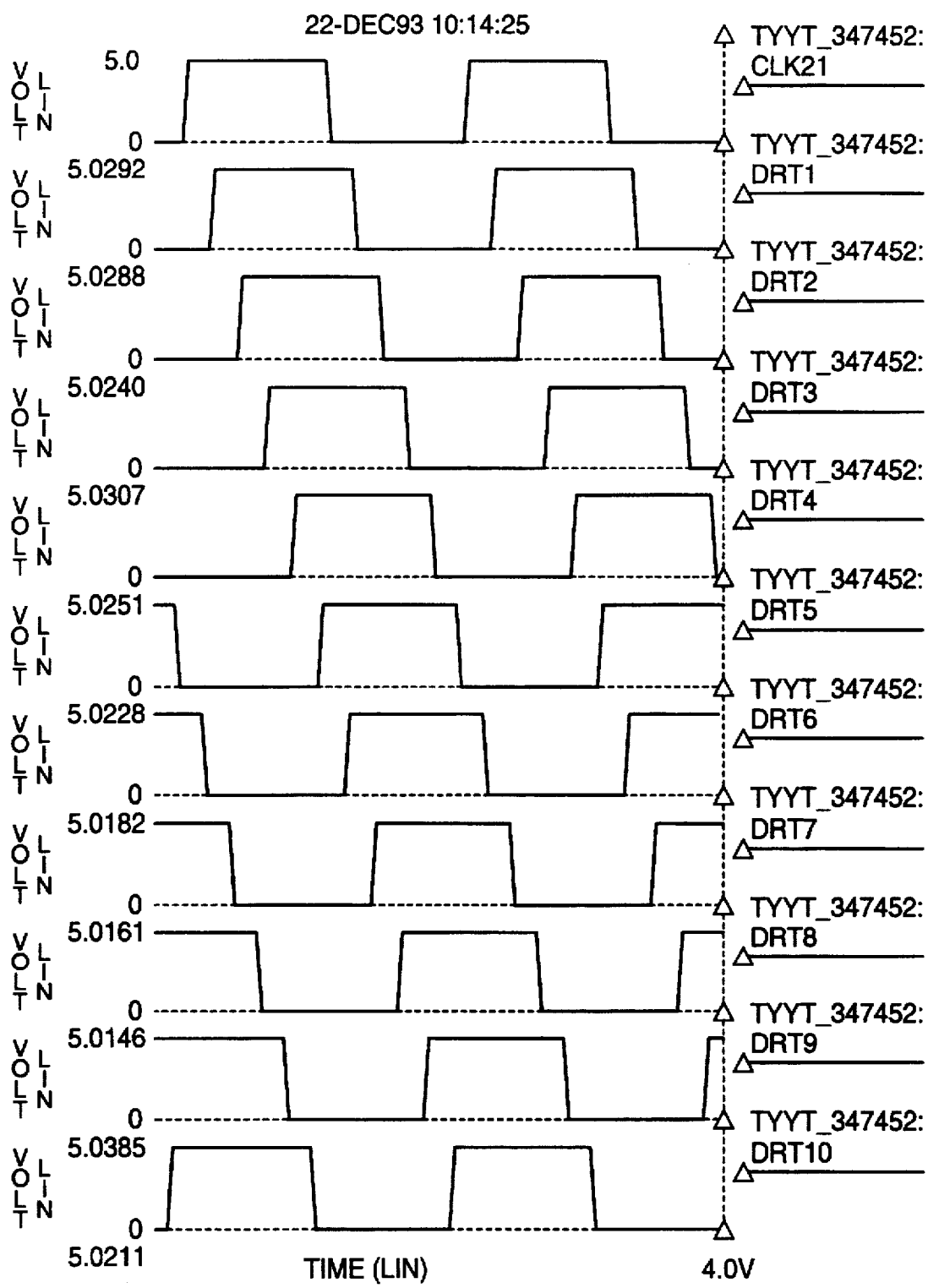
FIG. 10 shows the output waveforms for each delay line versus the input reference clock in accordance with the present invention.

To more clearly describe the operation of the above-identified delay line circuit 100 refer now to FIGS. 8–10 in conjunction with the following discussion.

FIG. 8 is a diagram of one voltage delay cell 102a of the voltage control voltage-controlled delay cell circuit 102 used with the present invention. The delay cell 102a of the present invention is similar to that of FIG. 1 except that the delay line output is not exclusively XORed with the phase signals PAO or PAB and the delay cell 102a comprises two of the delay cells of FIG. 1. In so doing, zero phase shift across the delay cell 102a is achieved (i.e., the output signal from delay cell 102a is in phase with the clock signal) and therefore, true timing delay of the incoming reference clock (CLK) can be achieved. In addition, as is well understood by those skilled in the art, the input to the inverters is produced by transistors of appropriate size and type to produce the desired output on the DAT line.

The sample-and-hold circuit 104 samples the values of the output voltages from the last delay cell 102a at the clock phase transitions. The sample and hold circuit 104 comprises two sampling circuits 144 that operate in parallel to provide the desired output. Each of the circuits 144 samples one of the two outputs from the voltage-controlled delay line circuit 102 on alternate clock phases. The result of the sampled outputs are then filtered and feedback as voltage control (Vcrtl) 120. If the total delay through the voltage controlled delay line circuit 100 (sampled at the last stage delay cell 1020) is less than the clock period, then a voltage slightly less than VDD will be sampled to the sample-and-hold circuit 104.

Vctrl 120 will then begin increasing to add more delay through each delay cell 1020, thereby causing the total delay through the delay line circuit 100 to increase. When the total delay from the delay line circuit 100 is equal to the reference clock period, the Vctrl 120 will reach a steady-state voltage to maintain the total delay at approximately the clock period of a reference clock. Similarly, if the total delay from the delay line circuit 100 is longer than the reference clock period, then a voltage slightly above ground will be sampled to the sample-and-hold circuit 104. Vctrl 120 then begins decreasing to speed up each delay cell 1020, thereby causing the total delay through the delay line circuit 100 to decrease.

Referring now to FIG. 9, a block diagram of an on-chip reset limiting circuit 106 used with the present invention is shown. The on-chip reset limiting circuit 106 comprises a reset flip-flop 202 which receives a system reset signal at the input. The system reset signal is also coupled to an input of an inverter 204. The output of the inverter 204 is coupled to a second input of the flip-flop 202. The clock signal is coupled to the clock input of D flip-flops 206 and 208 respectively. The Q output of flip-flop 202 is coupled to the D input of flip-flop 206 and one of the inputs of a NAND gate 210. The output of flip-flop 206 is coupled to the D input of flip-flop 208. The Q output of flip-flop 208 is coupled to a second input of the NAND gate 210. The output of the NAND gate 210 provides a reset signal that is limited to a predetermined period of time.

The on-chip reset circuit 106 receives the system reset signal and clock signal as inputs. The reset circuit 106 resets on a system reset transition edge for a predetermined clock period, for example, a two clock period, then the reset signal goes away while the system reset is still in the reset state. Since the system reset is much longer than the two clock period required to reset the delay line circuit 100, the remaining time of the system reset will enable the delay line circuit 100 to reach its steady-state condition. It should be understood that the time period for reset can be any length dependent upon the number and type of logic gates utilized.

The advantage of this reset method is that no sensing circuitry is required to monitor the delay line circuit 100 operation to issue a reset signal when the delay line operates in sub-harmonic mode. Therefore, this method of resetting is more reliable than conventional delay line circuits.

FIG. 10 shows a timing diagram of such a design with CLK20 being the precise input 20 MHz reference clock, DAT1-DAT10 being the 10 staggering timing pulses with a true representation of the delays. As is seen, the rising and falling edges of the delays are accurately represented. Hence, the delays are more precise than those provided by conventional delay line circuits.

The precise delay line circuit 100 herein described uses a simpler reset scheme to achieve a reset requirement needed by the delay line to operate in its fundamental mode and also to provide a true timing delay of the incoming reference clock which is desired for many applications.

It should be readily recognized by one of ordinary skill in the art that the improved delay line circuit can be implemented in a variety of says and the implementations would be within the spirit and scope of the present invention. For example, although the on-chip reset limit circuit 106 is disclosed that utilizes flip-flops and a NAND gate in its operation it should be understood that many types of logic devices can be utilized to provide such a circuit. Similarly although two flip-flops 206 and 208 were utilized to provide a two clock period reset limit, any number of flip-flops can be utilized to provide any length delay, and their use would be within the spirit and scope of the present invention.

Although the present invention has been described in accordance with the embodiments shown in the figures one of ordinary skill in the art will recognize there could be variations to those embodiments and those variations would be within the spirit and scope of the present invention.

Accordingly, many modifications may be made by one of ordinary skill in the art without departing from the spirit and scope of the present invention, the scope of which is defined solely by the appended claims.

What is claimed is:

1. A delay line circuit comprising:
   a delay stage for receiving a clock signal, the delay stage including a plurality of delay cells, the delay cells being coupled together to provide a delayed clock signal;
   a sample and hold circuit coupled to the delay stage for sampling the delayed clock signal and the clock signal to determine a phase difference therebetween; and
   a reset limiting circuit coupled to the delay stage and the sample and hold circuit for receiving an external system reset signal, the external system reset signal comprising a power on reset signal externally input to the reset limiting circuit, and the clock signal and for resetting the sample and hold circuit and issuing a reset signal at a transition edge of the external system reset signal for a predetermined period of time based on the clock signal without monitoring the delay line circuit operation.

2. The delay line circuit of claim 1 in which each of the plurality of delay cells comprises first and second delay circuits.

3. The delay line circuit of claim 2 wherein each of the plurality of delay cells provide a delay signal in phase with the clock signal.

4. The delay line circuit of claim 1 in which the reset limiting circuit comprises:
   a reset means for receiving the external system reset signal;
   a predetermined time period setting means coupled to the reset means for receiving a clock signal and an output signal from the reset means; and
   a logic gate coupled to the reset means and the predetermined time period setting means for providing a reset signal which is limited to a predetermined time period that is less than the system reset time period.

5. The delay line circuit of claim 4 in which the reset means comprises a first flip-flop means.

6. The delay line circuit of claim 4 in which the predetermined time period setting means comprises:
   a second flip-flop means coupled to the first flip-flop means; and
   a third flip-flop means coupled to the second flip-flop means for receiving the clock signal and receiving an output from the second flip-flop means.

7. The delay line circuit of claim 6 in which the logic gate comprises a NAND gate.

8. The delay line circuit of claim 1 in which the reset limiting circuit comprises:
   a first flip-flop means for receiving the external system reset signal;
   a second flip-flop means coupled to the first flip-flop means for receiving a clock signal and an output signal from the first flip-flop means;

third flip-flop means coupled to the second flip-flop means for receiving the clock signal and receiving an output from the second flip-flop means;

a logic gate coupled to the first flip-flop means and a the third flip-flop means for providing a reset signal which is limited to a predetermined time period that is less than the system reset time period.

9. The delay line circuit of claim 8 in which the first flip-flop means comprises a reset flip-flop and an inverter coupled to an input of the reset flip-flop.

10. The delay line circuit of claim 8 in which the second and third flip-flop means comprise D flip-flops.

11. The delay line circuit of claim 8 in which the logic gate comprises a NAND gate.

12. A delay line circuit comprising:

a delay stage for receiving a clock signal, the delay stage including a plurality of delay cells, the delay cells being coupled together to provide a delayed clock signal;

a sample and hold circuit coupled to the delay stage for sampling the delayed clock signal and the clock signal to determine a phase difference therebetween; and a reset limiting circuit coupled to the delay stage and the sample and hold circuit for receiving an external system reset signal, the external system reset signal comprising a power on reset signal externally input to the reset limiting circuit, and the clock signal and for resetting and issuing a reset signal at a transition edge of the external system reset signal for a predetermined period of time based on the clock signal without monitoring the delay line circuit operation, the reset limiting circuit further comprising a reset means for receiving the external system reset signal, a predetermined time period setting means coupled to the reset means for receiving a clock signal and an output signal from the reset means, and a logic gate coupled to the reset means and the predetermined time period setting means for providing the reset signal which is limited to a predetermined time period that is less than the external system reset time period.

13. The delay line circuit of claim 12 in which each of the plurality of delay cells comprises first and second delay circuits.

14. The delay line circuit of claim 13 wherein each of the plurality of delay cells provide a delay signal in phase with the clock signal.

* * * * *